US005524036A

United States Patent [19]

Miwada

[11] Patent Number: 5,524,036

[45] Date of Patent: Jun. 4, 1996

[54] CHARGE TRANSFER DEVICE HAVING CHARGE INJECTION SOURCE FOR RESET DRAIN REGION

[75] Inventor: Kazuo Miwada, Tokyo, Japan

[73] Assignee: NEC Corporation, Japan

[21] Appl. No.: 250,553

[22] Filed: May 27, 1994

[30] Foreign Application Priority Data

May 27, 1993 [JP] Japan .................................... 5-148585

[51] Int. Cl.$^{6}$ ...................................................... H01L 49/02

[52] U.S. Cl. ........................... 377/63; 327/390; 327/565; 327/284

[58] Field of Search .................................... 307/607, 246, 307/303.1, 482, 578; 377/63; 327/390, 565, 284

[56] References Cited

U.S. PATENT DOCUMENTS 5,224,134 6/1993 Miwada .................................... 377/63

*Primary Examiner*—Magaret Rose Wambach

[57] ABSTRACT

A charge transfer device having an improved signal stage is disclosed. This stage includes a floating region formed in a semiconductor layer and receiving signal charges from a charge transfer stage, a reset drain region formed in the semiconductor layer adjacently to the floating region, a reset gate for resetting the floating drain region in potential to the reset drain region, an absorption region formed in the semiconductor layer adjacently to the reset drain region, a barrier gate supplied with a constant voltage to form a channel region between reset drain region and the adsorption region, and a charge injection source connected to the reset drain region to inject charges thereinto.

18 Claims, 7 Drawing Sheets

51
T1
OUT
RL
VG
23
C
VB
(5V)
VB
Ø2
Ø1
VOG
ØR
14a
14b
15a
15b
16
17
21
18
20
22
13
P
12
19
11
TRE
171
TBR
181

51
VB
T1
OUT
RL
RIJ
VB
(5V)
Nvg
23
VB
Ø2
Ø1
VOG
ØR
14a
14b
15a
15b
16
17
21
18
VG
22
20
13
11
P
12
19
TRE
171
TBR
181

CHARGE TRANSFER DEVICE HAVING CHARGE INJECTION SOURCE FOR RESET DRAIN REGION

BACKGROUND OF THE INVENTION

The present invention relates to a charge transfer device employing a charge coupled device (CCD) and, more particularly, to an improvement in a signal output stage thereof for detecting charges transferred from the CCD and for outputting a voltage level responsive thereto.

The signal output stage of a charge transfer device is, generally, equipped with a floating diffusion region formed in a semiconductor substrate. This region is supplied with and thus temporarily stores the transferred charges. In response to the charges thus stored, an output voltage level is derived representing the amount of the stored charges. Therefore, it is necessary to remove the charges stored in the floating region to reset the voltage level thereof each time the output voltage is derived.

To this end, a reset diffusion region is formed in the semiconductor substrate adjacently to the floating diffusion region. A reset gate electrode is formed over the part of the semiconductor substrate between the floating diffusion region and the reset diffusion region with intervention of a gate insulating film. The reset diffusion region is supplied with a certain reference voltage such as a power supply voltage of the device, and the reset gate electrode is supplied with a reset signal each time the output voltage is derived. The reset signal causes a channel region to be formed between the floating and reset regions, so that the charges stored in the floating region are transferred to and thus absorbed by the reset region.

In this case, in order to remove all the charges from the floating diffusion region to ensure the reset function, it is required to supply such a reset signal that induces a sufficient channel region under the reset gate electrode. For example, in a case where each of the floating and the reset diffusion regions is of an N-type, the potential well for electrons under the gate electrode must be deeper than that of the reset diffusion region. To this end, a reset signal having a sufficiently high level is needed. The reset signal is further recruited to be supplied with a high frequency. However, it is difficult to produce a reset signal satisfying both of a high frequency and a high voltage level. Therefore, some devices have been proposed to overcome the problems with the reset operation described above.

Referring to FIG. 1, there is shown one such improved device. This device is disclosed in Japanese Laid-Open Patent Application (Kokai) Sho 61-224357. FIG. 2 shows an graph of potential levels of electrons transferred in the device of FIG. 1. FIG. 3 shows a timing chart of the signals φ1, φ2 and φR shown in FIG. 1. FIG. 4 shows a graph of voltages at portions of a surface of the semiconductor substrate 1 versus voltages of corresponding gate electrodes 4*a*, 4*b*, 5*a*, 5*b*, 6*a* and 6*b*. The device of FIG. 1 is a surface channel type CCD (SCCCD) wherein the charge transfer channel regions are selectively formed on a surface of a p-type semiconductor substrate 1 in response to voltage levels of the transfer electrode 4*a*, 4*b*, 5*a* and 5*b* supplied with the transfer control signals φ1 and φ2. The substrate 1 is supplied with a back bias voltage Vbs such as −2.5 V. A floating diffusion region 2 and a reset diffusion region 3 are of n-type and form a reset transistor TR of n-channel MOS type with a reset gate electrode 7. In this conventional device, the reset voltage to be supplied to the reset diffusion region 3 is generated by a cascade circuit having transistors T3 and T4 which is connected between the power supply voltage line VB, which voltage VB is 5 V for example, and a ground line GND and outputs an intermediate voltage V1 which is 3 V, for example, and lower than the power supply voltage VB. The intermediate voltage V1 is also supplied to the output gate electrodes 6*a* and 6*b* as shown in FIG. 1. The transfer control signals φ1 and φ2 and the reset signal φR have an amplitude between the power supply voltage level VB and the ground voltage level GND as shown in FIG. 3.

In operation, at the time t1, the transfer control signals φ1 and φ2 and the reset signal φR respectively become high, low and high levels so that the voltages of the surface portions under the gate electrodes 4*a*, 5*a* and 6*a* become 2.3 V and the voltages of the surface portions under the gate electrodes 4*b*, 5*b* and 6*b* become 4.5 V as shown in FIG. 4. Therefore, the potential levels of electrons at the each part of the surface of the semiconductor substrate 1 are brought into a reset state as shown in FIG. 2 by a dotted line. Since the voltage V1 of the reset diffusion region 3, that is 3 V as mentioned above, is set sufficiently lower than the voltage of the surface region under reset gate electrode 7, that is 4.5 V as mentioned above, the potential well W21 of the potential of electrons formed under the reset gate electrode 7 becomes deeper than the well W23 formed in the diffusion regions 3. Thus, the well W21 efficiently transfers the carriers in the potential well W22 in the floating diffusion region 2 to the well W23 in the reset diffusion region 3. Therefore, the potential level of the floating diffusion region 2 is reset and adjusted to a certain initial level determined by the potential level of the well W21.

At the time t2, that is when the reset signal φR is at its low level, the floating diffusion region enters a floating state and maintains its initial level owing to parasitic capacitances of the pn junction between the region 2 and the semiconductor substrate 1. Subsequently, at the time t3, the potential levels of each part of the surface of the substrate 1 enters a transfer state as shown in FIG. 2 by a solid line and the carriers are transferred from the potential well W25 under the transfer gate 5*b* to the well W22 through the fixed potential area P21 under the output gate electrodes 6*a* and 6*b*. In this device, the output gate electrodes 6*a* and 6*b* bear a function to form the fixed potential area P21 which serves as a part of a potential slope for transferring the carriers to the well W21 at the time t3 and as a potential barrier for preventing reverse transfer of the carriers from the well W21 to the well W25. When the carriers are transferred to the floating diffusion region 2, the voltage level VFD of the floating diffusion region 2 is detected by the output circuit 01 as shown in FIG. 1 which outputs the signal OUT. Therefore, this device merely necessitates the reset signal R having a power supply voltage of the device, eliminating any circuit specialized in forming a high frequency reset signal having a high voltage.

Turning to FIG. 5, a device according to another prior art is shown therein. This device is disclosed in Japanese Laid-open Patent Application (Kokai) Hei 3-129744. FIGS. 6 and 7 show graphs of potentials of electrons of each part of the surface of the substrate shown in FIG. 5. According to FIG. 5, an n-type buried channel layer 12 having a low impurity concentration is formed on a surface of a semiconductor substrate 11, in which further formed are an n-type floating diffusion region 20 connected to a output circuit 50, an n-type reset diffusion region 21 connected to a capacitor C and an n-type absorb diffusion region 22 connected a voltage generator 23 for generating a constant high level voltage VG, that is 12 V. The surface of the buried channel layer 12 is covered with a gate insulating film 13 on which a reset gate electrode 17 supplied with a reset signal φR and a barrier gate electrode 18 supplied with a power supply voltage VB, that is 5 V, are formed. The floating diffusion region 20, the reset diffusion region 21 and the reset gate electrode 17 form a reset transfer gate TRE and the reset diffusion region 21, the absorb diffusion region 22 and the barrier gate electrode 18 form a barrier transfer gate TBR as shown in FIG. 5. Transfer gate electrodes 14*a*, 14*b*, 15*a* and 15*b* are supplied with transfer control signals φ1 and φ2 in a similar manner as the device of FIG. 1. An output gate electrode 16 is supplied with a low level voltage VOG taking a level of about 1 V and sets a potential level of electrons in the region just below the output gate electrode 16 at the potential ψOG as shown in FIG. 6. A potential level ψB of electrons in the channel region of the barrier transfer gate TBR is determined by a potential level at the absorb diffusion region 22 and the voltage VB supplied to the barrier gate electrode 18. Since the barrier transfer gate TBR is constantly conductive in such a condition, the potential level ψRD at the reset diffusion region 21 is set to be equal to the potential ψB. A potential level of electrons in the channel region just below the reset gate electrode 17 is determined by a high or a low voltage of the reset signal φR as shown in FIG. 6 wherein the potential according to the high level of the reset signal φR is labeled ψR. In this device, since the channel region of the reset transfer gate TR is of n-type semiconductor region having a low impurity concentration, when the reset signal φR is at a low level, the potential barrier B1 formed under the reset gate electrode 17 can be set high so as to prevent the transfer of the electrons therethrough and, at the same time, when the reset signal φR is at a high level, the potential level ψR at the channel region under the reset gate electrode 17 can be decreased to a level lower than the potential ψRD as shown in FIG. 6 owing to a short channel effect in the reset transfer gate TRE. The electrons transferred to the reset diffusion region 21 are first stored in the capacitor C and then transferred to a deep potential well W61 formed at the absorb diffusion region 22 which is supplied with the high voltage VG of 12 V. The capacitor C which has a respectively large capacity is charged constantly according to the potential level ψRD and performs a function of maintaining the potential level ψRD at the reset diffusion region 21 stably when the electrons are transferred from the floating diffusion region 20 so as to complete the transfer of electrons from the floating diffusion region 20 safely. Therefore, in this device, the reset operation is achieved by using a reset signal φR having its high level not larger than the power supply level of the device and, at the same time, owing to the deep potential well W61, the reset operation is performed certainly even under the condition of a low power supply level, such as 5 V or 3 V, so that the output operation is performed stably.

However, in the conventional device of FIG. 1, since the reset voltage V1 supplied to the reset diffusion region 3 is a intermediate voltage V1 which is lower than the power supply voltage VB, the reset operation necessitates a considerably long time. If the reset operation is performed at high speed, on the contrary, the floating diffusion region 2 is not discharged sufficiently so that the output signal level of the following cycle is disrupted.

In the device of FIG. 5, on the other hand, since the reset diffusion region 21 is connected to a large capacitance C so as to maintain the potential level ψRD by eliminating the potential change caused by the direct current to or from the reset diffusion region, a passing change in the power supply voltage VB causes a potential change α in the reset diffusion region 21 and the potential change α is maintained by the capacitor C, deteriorating the output property of the device for a considerably long time thereafter. That is, as shown in FIG. 6, once the change in power supply voltage VB, which is supplied to the barrier transfer gate electrode 18, causes the potential of the channel region of the barrier transfer gate TRB to change to the potential ψB+α at the time t1, the potential level ψRD at the reset diffusion region 21 is set to be equal to the same potential ψRD'=ψB+α as mentioned above. Then, at the time t2, after the power supply voltage VB is restored to the initial voltage level and the potential ψB+α is also restored to the potential ψB as shown in FIG. 7, since the potential barrier B2 is formed at the channel region of the barrier transfer gate TBR to inhibit any transfer of electrons therethrough, the potential ψRD' cannot be recovered but forms a potential well W71 having a depth of α as shown in FIG. 7, causing potential changes in output signals in following output cycles. The potential ψRD' is restored only by electrons transferred from the floating diffusion region 20 through many output cycles, resulting in decrease in reliability of the device.

SUMMARY OF THE INVENTION

Therefore, an object of the present invention is to provide a charge coupled device capable of outputting an output signal with high reliability.

Another object of the invention is to provide a CCD capable of operating with a low power supply voltage.

Still another object of the invention is to provide a CCD having a high reliability despite changes in a power supply voltage of the device.

A charge transfer device according to the present invention includes a reset region receiving signal charges from an output floating region which is connected to a charge injection element such as a resistor or constant current source. The voltage of the reset region thereby is held constant to improve the reliability of output and reset operations of the device.

Preferably, the device of the present invention comprises a transfer channel region of one conductive type for transferring signal charges formed on a semiconductor layer, an output region of the one conductive type formed on the semiconductor layer and connected to the transfer channel, an output circuit for detecting voltages of the output region, a first control gate formed over a first portion of the semiconductor layer, the first portion being adjacent to the output region, a first reset region of the one conductive type formed on the semiconductor layer and being adjacent to the first portion, the first control gate adjusting a voltage of the first portion and selectively forming a first channel region in the first portion, and thereby the first reset region selectively drawing the signal charges from the output region via the first channel region, a second reset region of the one conductive type formed on the semiconductor layer and connected to a first node of a first voltage for drawing the signal charges from the first reset region, and a charge injection element connected to the first reset region for injecting charges continuously to the first reset region from a second node of a second voltage, the second reset region thereby continuously drawing the charges from the charge injection element.

BRIEF DESCRIPTION OF THE DRAWINGS

The above mentioned and other objects, advantages and features of the present invention will be more apparent from the following detailed description taken in conjunction with the accompanying drawings, in which.

DETAILED DESCRIPTION OF PREFERRED EMBODIMENTS

Figure 1:
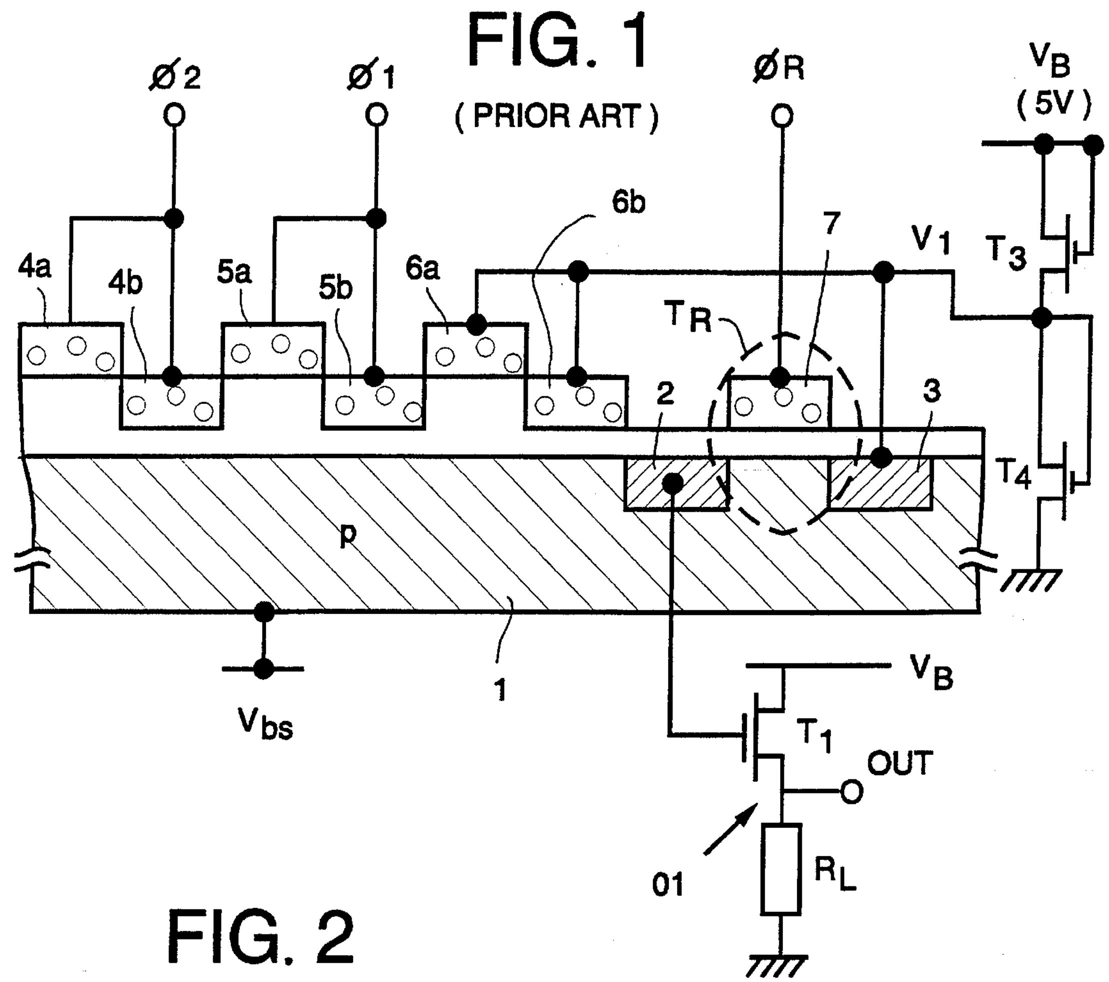
FIG. 1 is a cross sectional view of a conventional charge coupled device.
Figure 2:
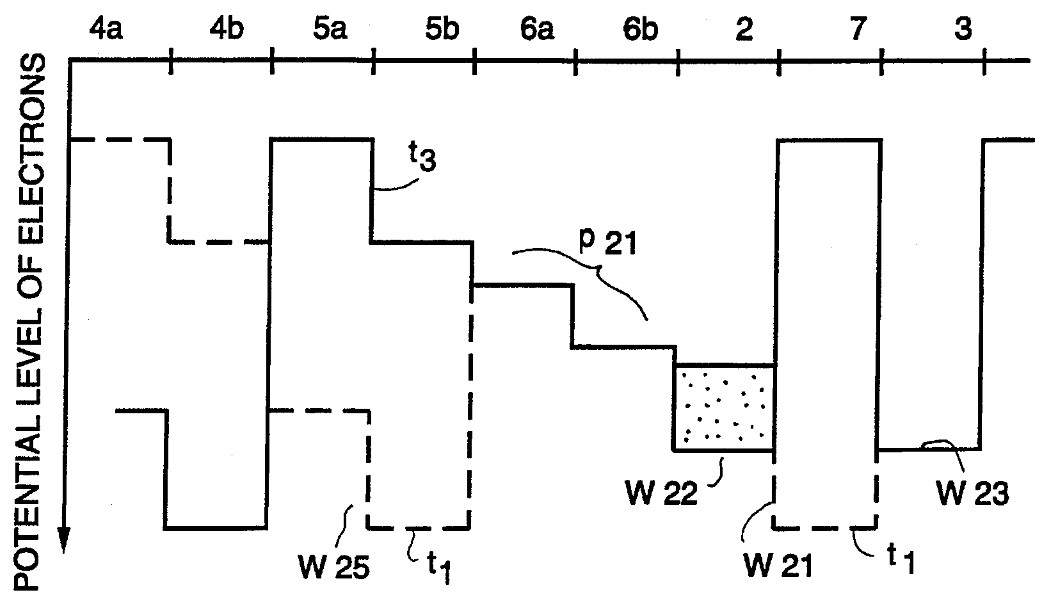
FIG. 2 is a graph of potential levels of each portion of the device of FIG. 1.
Figure 3:
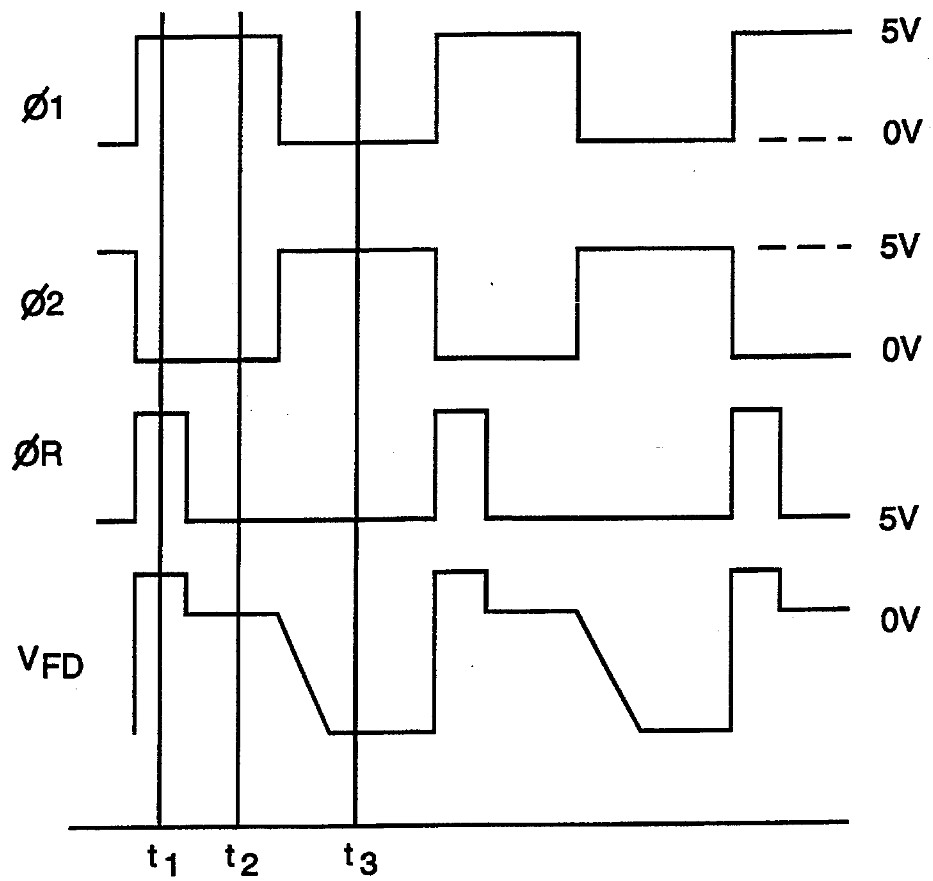
FIG. 3 is a timing chart of signals shown in FIG. 1.
Figure 4:
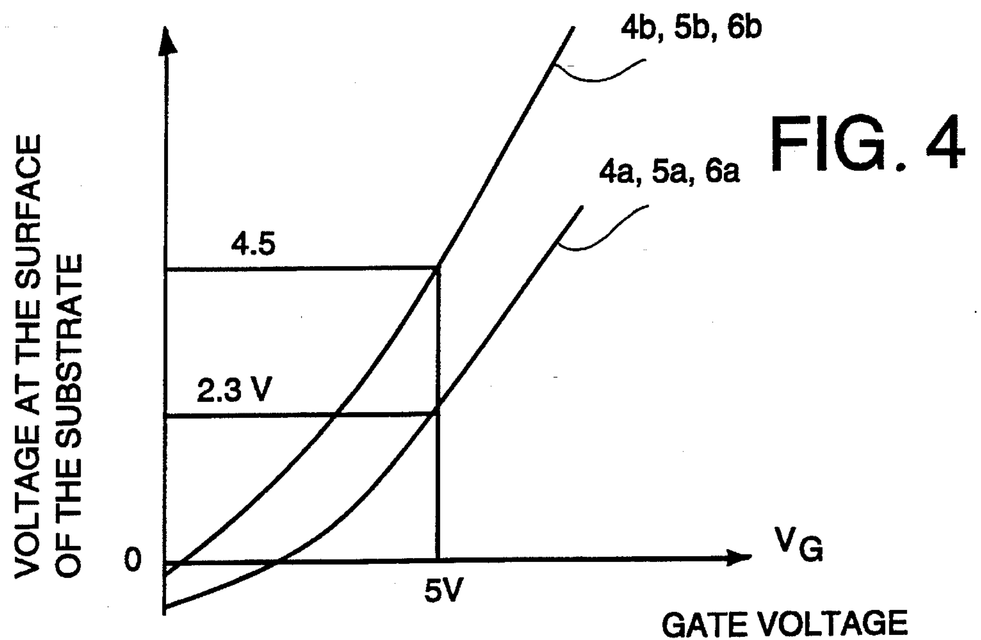
FIG. 4 is a graph of voltage levels between a substrate and gate electrodes shown in FIG. 1.
Figure 5:
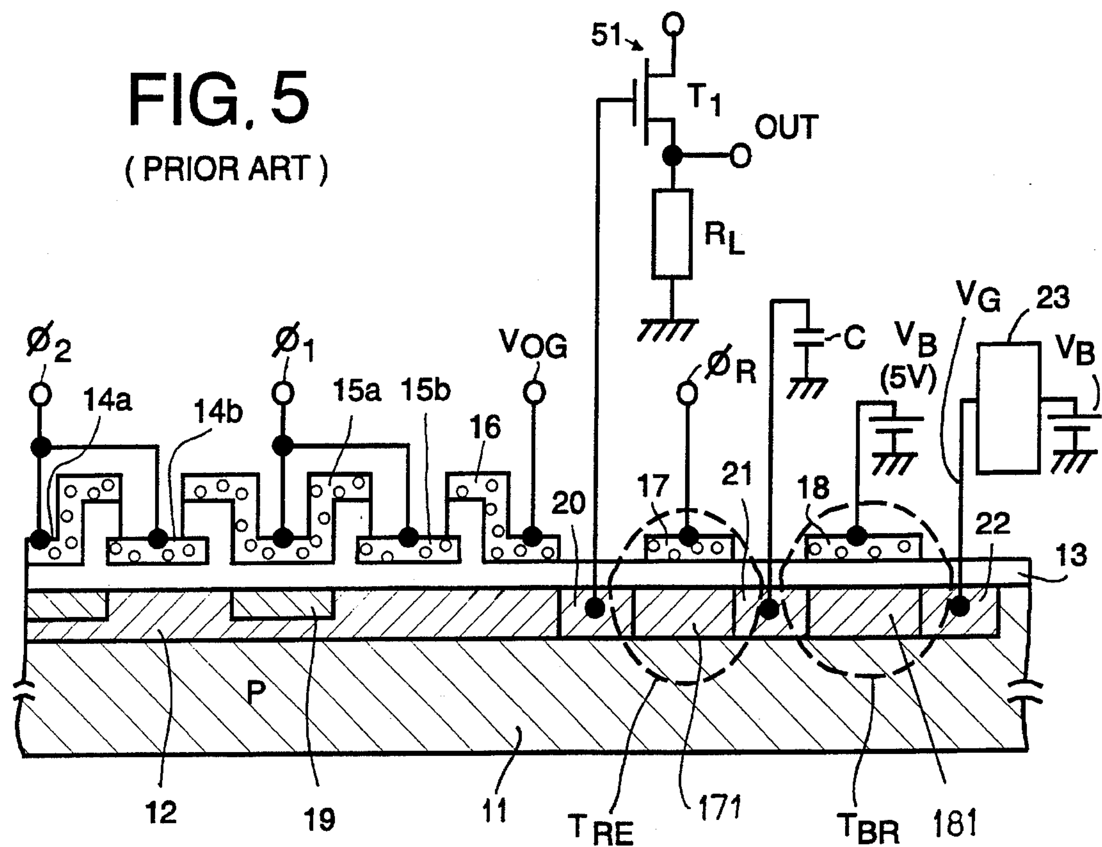
FIG. 5 is a cross sectional view of another conventional device.
Figure 8:
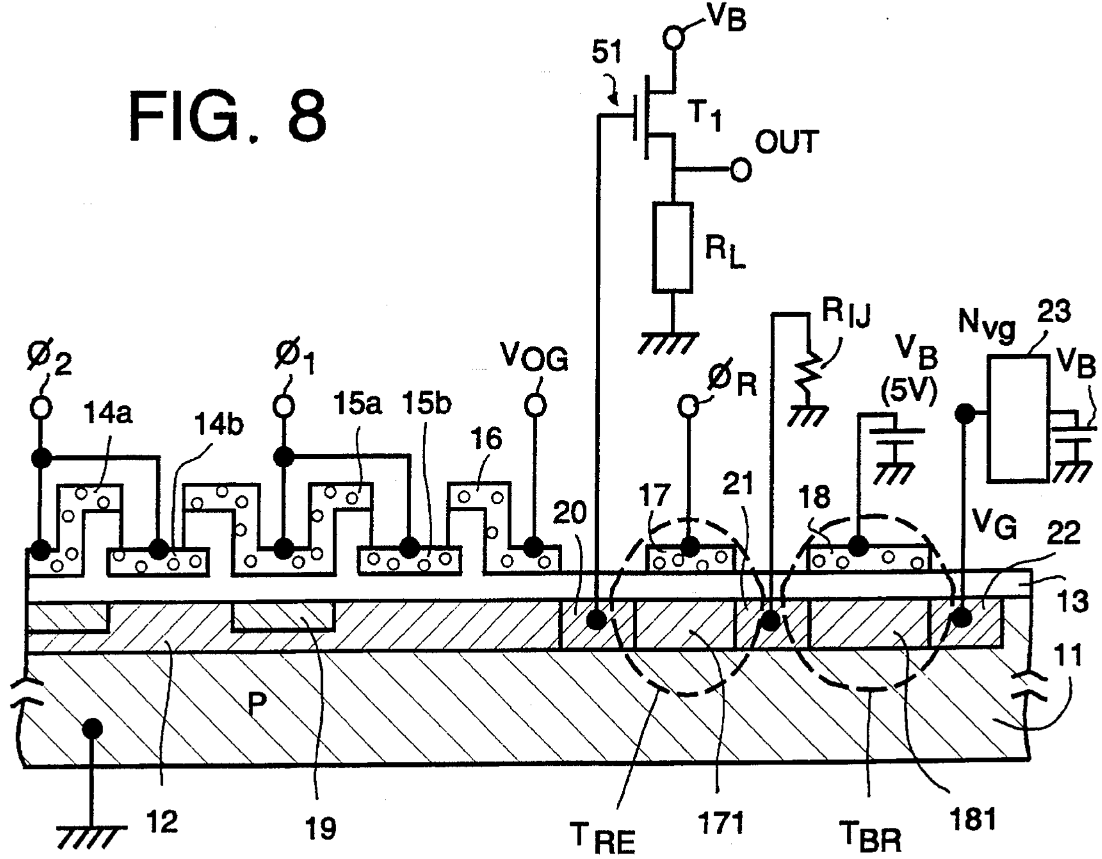
FIG. 8 is a cross sectional view of a device of a first embodiment of the present invention.

Referring now to FIG. 8, there is shown a charge transfer device according to the first embodiment of the present invention in which the same constituents as those shown in FIG. 5 are labeled by the same symbols to omit the further description thereof. In the device shown therein, an n-type channel diffusion layer 12 is formed with an impurity concentration of $2\times10^{16}cm^{-3}$, a depth of 1 μm and a width of 10 μm in a p-type semiconductor substrate 11 having an impurity concentration of $5\times10^{15}cm^{-3}$. Formed in the channel diffusion layer 12 are n-type barrier regions 19 having an impurity concentration of $1\times10^{15}cm^{-3}$ and a thickness smaller than 0.1 μm. Further formed in the substrate 11 are a floating diffusion region 20, a reset drain region 21 and an absorption diffusion region 22 each having an impurity concentration of about $2\times10^{17}$ $cm^{-3}$ and an thickness 27 smaller than 1 μm. On the surface of the substrate 11, a dry thermally grown gate oxide film 13 is formed with a thickness of 100 nm. On the gate oxide film 13 are formed storage control electrodes 14*b* and 15*b*, barrier control electrodes 14*a* and 15*a*, an output gate electrode 16, a reset gate electrode 17 and a barrier transfer gate electrode 18 by using phosphorus doped n-type poly-silicon films having an sheet resistance of 20Ω/□ and a thickness of 400 nm. The barrier transfer gate electrode 18 has its length LB of 10 μm and each of the remaining gate electrodes 14*a*, 14*b*, 15*a*, 15*b*, 16 and 17 has a length LR of 5 μm.

Figure 9:
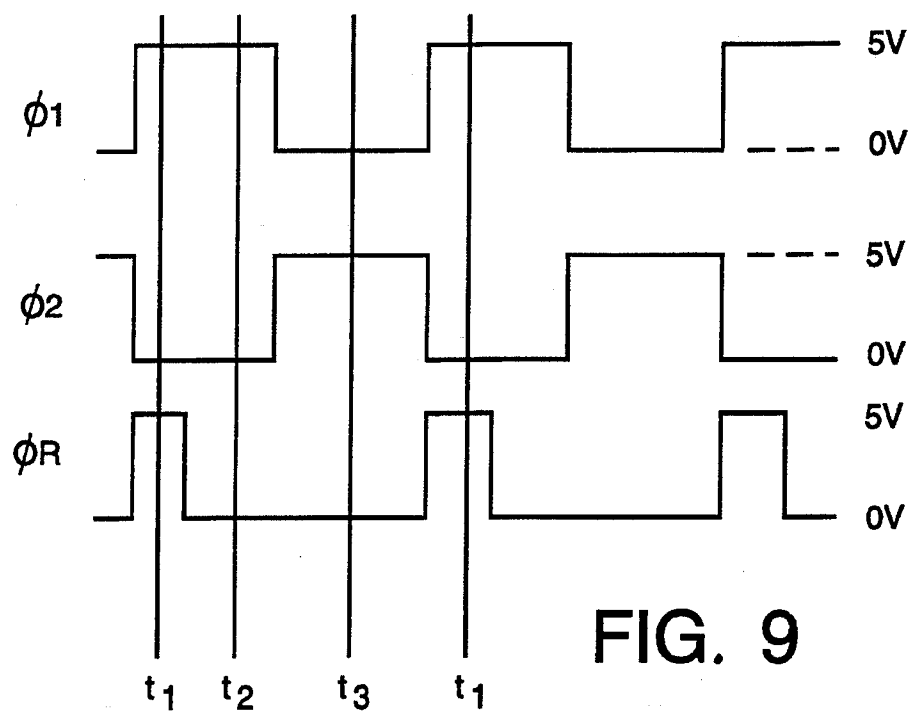
FIG. 9 is a timing chart of the signals shown in FIG. 8.
Figure 10:
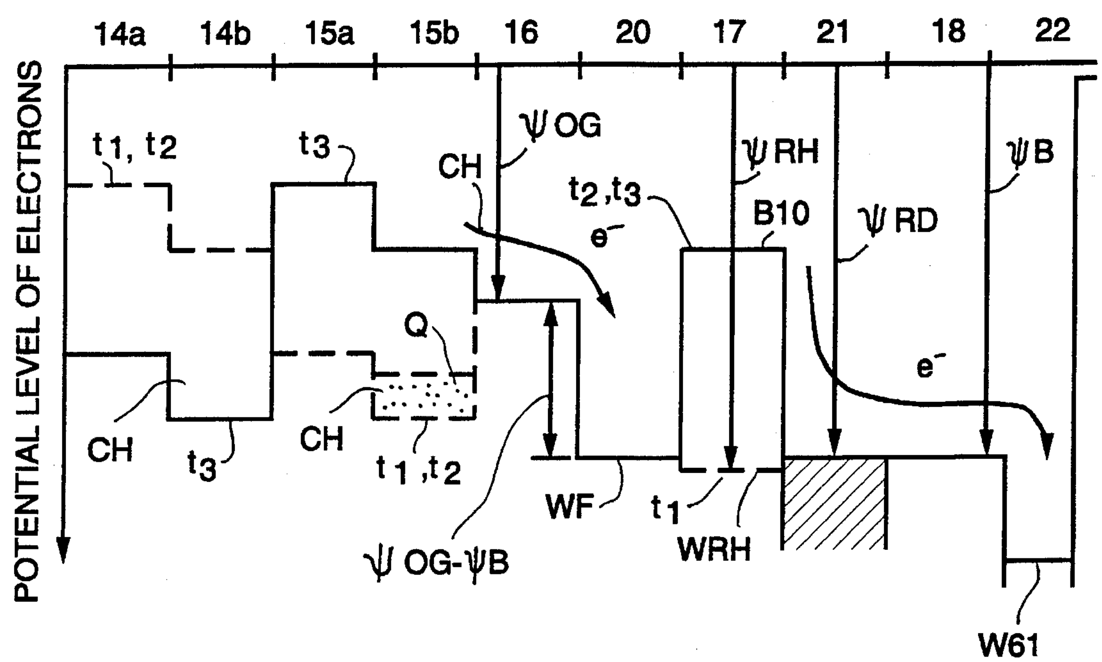
FIG. 10 is a graph of potential levels of each part of the device shown in FIG. 8.

The storage and barrier control gate electrodes 14*a*, 14*b*, 15*a* and 15*b* are supplied with transfer control signal φ1 and φ2 as shown in FIG. 8. The output gate electrode 16 is supplied with a low level output control signal VOG, that is about 1 V. The reset gate electrode 17 is supplied with a reset signal φR. Each of the transfer control signals φ1 and φ2 and the reset signal φR has an amplitude between a power supply level VB of the device, that is 5 V, and a ground voltage GND as shown in FIG. 9. That is, the transfer control signals φ1 and φ2 have the same amplitude and frequency as each other but have different phases from each other by 180°. Thus, the transfer channel regions CH for transferring the signal charges Q are selectively formed under the storage and barrier control gate electrodes 14*a*, 14*b*, 15*a* and 15*b* according to the transfer control signals φ1 and φ2, as shown in FIG. 10. The reset signal φR has the same phase as the transfer control signal φ1 but has a smaller duty cycle than the signal φ1. The floating diffusion region 20 is connected to an output circuit 51 including a MOS type transistor T1 having a gate electrode supplied with a voltage signal from the floating diffusion region 20 and a source electrode connected to the power supply line VB, and a resistance element RL connected between the drain electrode of the transistor T1 and the ground line GND. The output circuit 51 has an output terminal connected to the drain electrode of the transistor T1. The barrier transfer gate electrode 18 is supplied with the power supply voltage VB constantly. The absorption diffusion region 22 is supplied with an high level constant voltage VG such as 12 V from a voltage generator 23.

In this device, the reset drain region 21 is connected to one terminal of a resistor RIJ which is provided in accordance with the present invention. This resistor RIJ has the other terminal connected to the ground line GND and thus discharges excessive charges from the reset diffusion region 21 or injects electrons thereinto to compensate the electrons or charges of the reset region 21. The resistor RIJ is formed to have a resistance in an order of ten mega ohms to allow a leakage current in an order of hundred nano amperes to flow therethrough. The resistor RIJ is made of a diffusion resistive region formed in the semiconductor substrate 11 or of a poly-silicon resistor formed on an insulating film covering the substrate 11.

Figure 11:
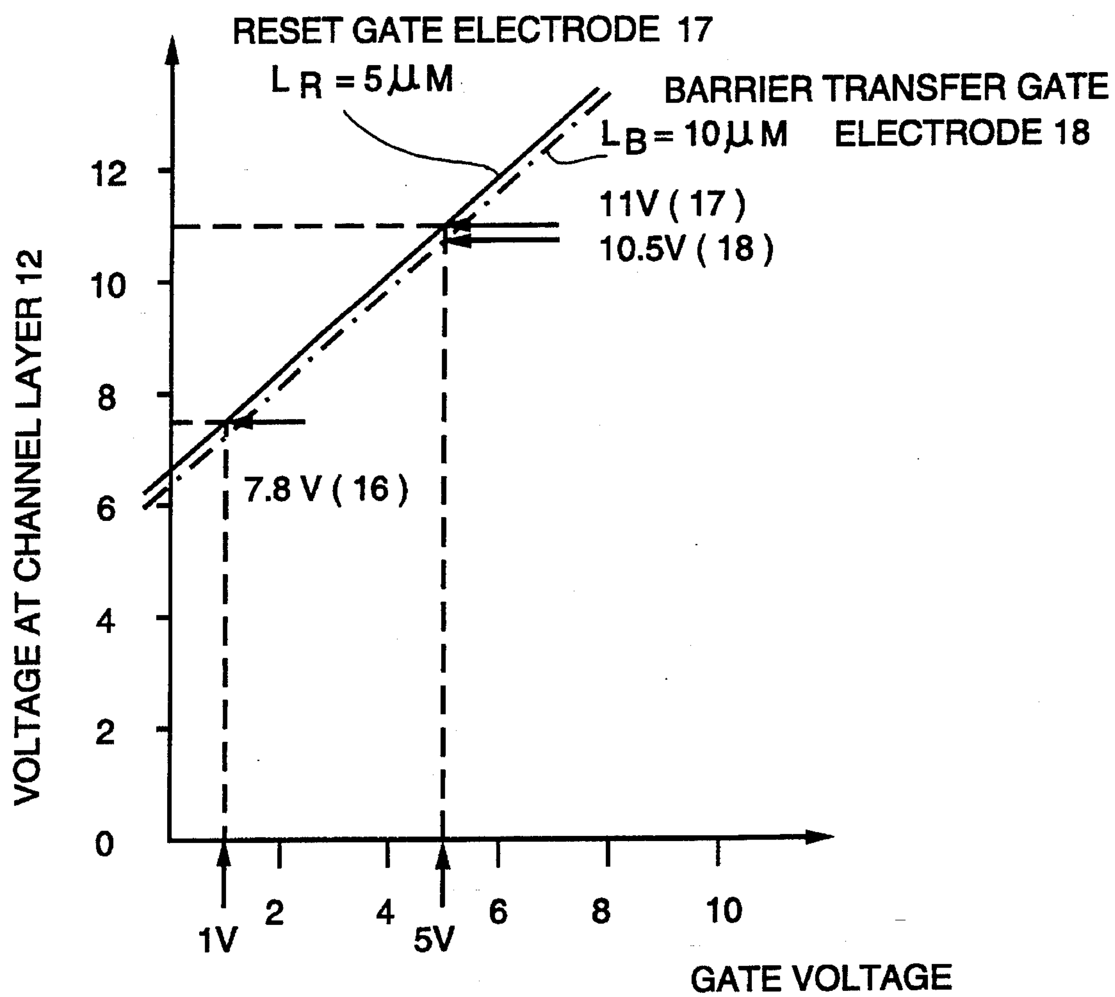
FIG. 11 is a graph of potential levels of a surface region of a semiconductor substrate versus voltages of a gate electrode of the device shown in FIG. 8.

The operation of the device will be explained in detail. The potential level ψB of electrons in the channel region of the barrier transfer gate TBR is determined by the voltage VG supplied to the absorb diffusion region 22 and the voltage VB supplied to the barrier transfer gate electrode 18 as shown in FIG. 11. That is, the voltage at the channel region of the barrier transfer gate TBR is determined by the voltages VG and VB and is about 10.5 V which defines the potential ψB. In this case, a potential of electrons labeled with ψ is defined as a product of a voltage labeled with V by −1 wherein the coefficient −1 represents the sign of the elementary electric charge e(<0). The potential ψRH at the channel region of the reset transfer gate TRE at the time t1, that is when the reset signal φR is at a high level, is also defined by the corresponding voltage level at the channel region under the reset gate electrode 17, that is 11 V. The difference of voltages 10.5 V and 11 V at the channel portions just under the gate electrode 17 and 18 which have the see voltage 5 V leads to a short channel effect which is caused by the short length LR of the reset gate electrode 17. The potential ψOG at the portion of the channel layer 12 just under the output electrode 16 is also defined by the corresponding voltage of 7.8 V as shown in FIG. 11. According to FIG. 10, since the absorb diffusion region 22 is supplied with the high level voltage VG which makes a deep potential well W61, electrons in the reset diffusion region 21 are transferred to the well W61 via channel region under the barrier gate electrode 18 and the potential ψRD at the reset diffusion region 21 is set to be equal to the potential ψB.

Figure 6:
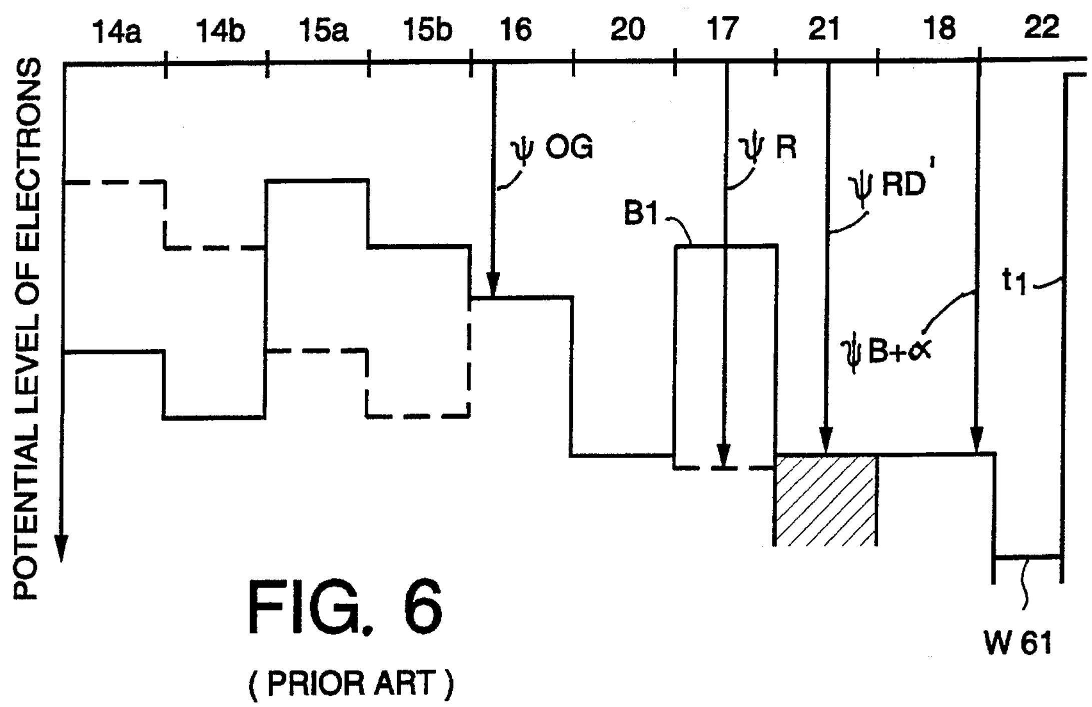
FIG. 6 is an graph of potential levels of each portion of the device of FIG. 5.
Figure 7:
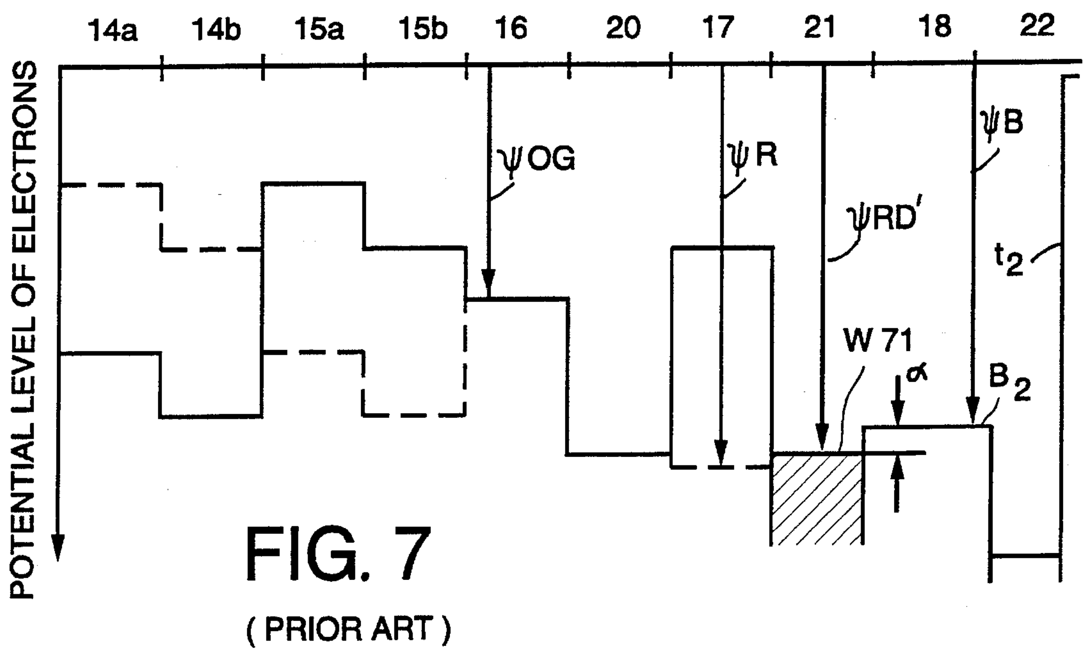
FIG. 7 is an graph of potential levels of each portion of the device of FIG. 5.

In this device, according to the invention, since the reset diffusion region 21 is connected to the resistance element RIJ, even when the power supply voltage VB of the device is changed in a short time owing to a noise pulse or the like, or during a certain time period just after the power of the device is turned on wherein the power voltage is unstable, causing changes in the potential ψB and ψRD as shown in FIGS. 6 and 7, the resistance element RIJ injects a required amount of electrons to the reset diffusion region 21. That is, when the potential ψRD at the reset diffusion region 21 is decreased by α as shown in FIG. 7 and forms the potential well W71, the resistance element RIJ injects electrons into the well W71 with an injection speed according to the depth α of the well W71. When the potential ψRD is restored to the initial level, that is equal to the potential ψB, the electrons injected to the reset diffusion region 21 are transferred and absorbed in the absorb diffusion region 22 as a leak current as mentioned above. Accordingly, in this device, it takes only a few tens of nano seconds to restore the potential ψRD at the reset diffusion region whereas the conventional device of FIG. 5 necessitates several mill seconds. In this case, it is apparent that the leak current about some hundreds of nano amperes as mentioned above is sufficiently small and substantially takes no part in the total current consumption of the device.

The potential ψRH at the channel region of the reset transfer gate TRE is determined by the voltage of the reset signal φR at the time t1 as mentioned above and becomes lower than the potential ψRD or ψB as shown in FIG. 10. The potential barrier B10 at the channel region under the reset gate electrode 17 is decreased to the potential ψRD at the time t1, transferring the electrons in the floating diffusion region 20 to the reset diffusion region 21 and to the absorb diffusion region 22 correctly as shown in FIG. 10. That is, the reset diffusion region 21 accurately resets the voltage of the floating diffusion region 20. In this case, the potential ψRD at the reset diffusion region 21 may vary uncertainly for a while because of the electrons from the floating diffusion region 20 representing a signal charge. However, this time period of varying in the potential ψRD is sufficiently decreased by setting the electron injection ability of the resistance element RIJ to be great. For example, set the ratio of the amount of charges transferred from the floating diffusion region 20 versus the amount of charges from the resistance element RIJ about one to one hundred or so. It is also desirable to set the charge transferring ability of the barrier transfer gate TBR to be great so as to transfer or draw electrons in the reset diffusion region which are from both of the floating diffusion region 20 and the resistance element RIJ, mainly from the resistance element RIJ as mentioned above, and prevent a potential increase at the reset diffusion region 21. In detail, it is desirable to set the transferring ability of the barrier transfer gate TBR to be one hundred times, or more, larger than that of the resistance element RIJ. For example, the on resistance of the barrier transfer gate TBR is to be set less than a hundred kilo ohms in case the resistance element RIJ has its resistance about a ten mega ohms. After that, at the time t2, the reset signal φR is turned to its low level, making the potential barrier B10 at the channel region of the reset transfer gate TRE and electrically disconnecting the floating diffusion region 20 and the reset diffusion region 21. The floating diffusion region 20 enters to a floating state forming a potential well WF. At the time t3, that is, after the reset signal φR is turned to its low level and the transfer control signals φ1 and φ2 are turned to their low and high levels respectively, the potential barrier B10 remains at the channel region under the reset gate electrode 17 to prevent transfer of electrons therethrough. The storage and barrier electrodes 14*a*, 14*b*, 15*a* and 15*b* and the potentials under those electrodes function in nearly the same manner as the device of FIG. 5 and shown in FIG. 10. Therefore, the carriers, that are electrons in this case, are transferred by the storage and barrier electrodes 15*a* and 15*b* to the potential well WF at the floating diffusion region 20 at the time t3 and determine the potential or voltage level at the floating diffusion region 20 as shown in FIG. 10 which is detected by the output circuit 51. In this case, the storing ability of the floating diffusion region 20 for storing the charges transferred by the storage and barrier gate electrodes 15*a* and 15*b* is represented by the depth of the potential well WF, that is ψOG-ψB. With reference to the graph of FIG. 11, the potentials ψOG and ψB are −7.8 V and −10.5 V respectively. Therefore, the storing ability of the floating diffusion region 20 is 2.7 V, which determines a dynamic range of output signals of the device. The output signal is supplied to the gate electrode of the MOS transistor T1 in the output circuit 51 in this device. The MOS transistor T1 is capable of detecting signals having an amplitude more than 2 V. That is, the device according to the present invention has a sufficiently large dynamic range of the output signals.

Figure 12:
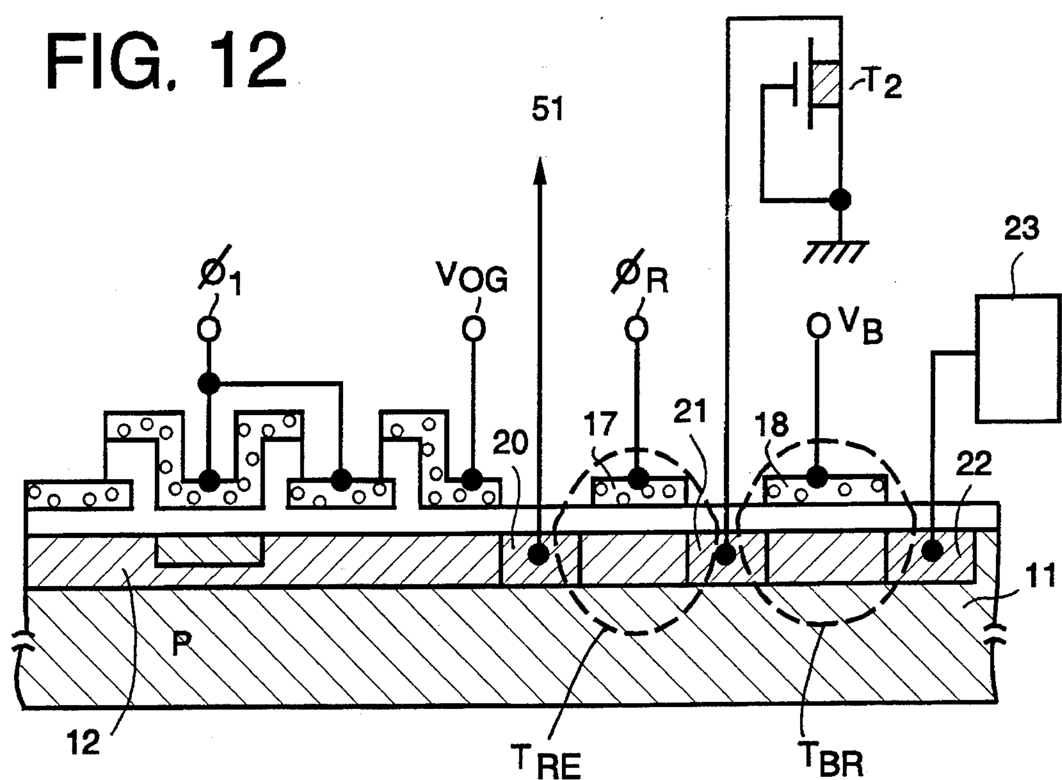
FIG. 12 is a cross sectional view of a device of a second embodiment of the invention.

Turning to FIG. 12, the device according to the second embodiment of the invention employs a depletion type MOS transistor T2 in place of the resistor RIJ shown in FIG. 8. The transistor T2 has a drain electrode connected to the reset diffusion region 21 and source and gate electrodes connected in common to the ground voltage line GND. Other parts are the same as those shown in FIG. 8. In the present embodiment, since the electron injection element is composed of the transistor T2 working as a constant current source, the electron injection is performed constantly, regardless of the potential ψRD of the reset diffusion region 21. Therefore, the reset operation for resetting the potential of the floating diffusion region 20 and the restoring operation for restoring the potential ψRD of the reset diffusion region 21 are performed more stably. The reliability of the device is made more efficient.

Figure 13:
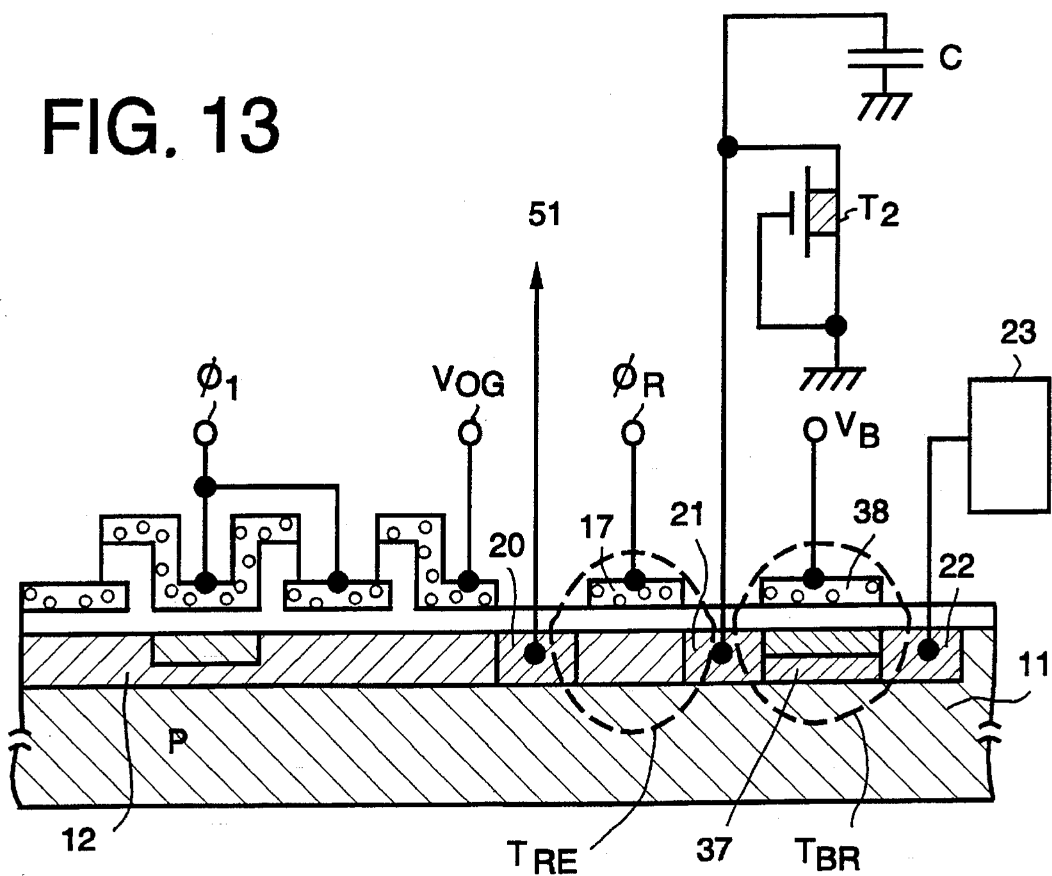
FIG. 13 is a cross sectional view of a device according to a third embodiment of the invention.

Referring to FIG. 13 showing the third embodiment of the invention, the device is equipped with a barrier transfer gate electrode 38 having its length LR the same as the length of the reset gate electrode 17 and, in order to generate the difference in voltages at the channel regions each corresponds to the barrier transfer gate electrode 38 and the reset gate electrode 17 as shown in FIG. 11, the barrier transfer gate TBR is equipped with a p-type barrier diffusion region 31 as shown in FIG. 13. It is also possible to form an n-type highly diffused region just under the reset gate electrode 17 so as to make the difference in the voltages as shown in FIG. 11. The device of the third embodiment is also equipped with a capacitor element C connected between the reset diffusion region 21 and the ground line GND in addition to the electron injection element T1 of the first embodiment or T2 of the second embodiment. Therefore, the potential ψRD at the reset diffusion region 21 is maintained more stably and the reliability of the reset operation and the output operation are further improved.

Although the present invention has been described with reference to a specific embodiment, this description is not meant to be construed in a limiting sense. Various modifications of the disclosed embodiment, as well as other embodiments of the present invention, will become possible to persons skilled in the art upon reference to the description of the present invention. It is, therefore, contemplated that the appended claims will cover any modifications or embodiments as fall within the true scope of the present invention.

What is claimed is:

1. A charge transfer device having a charge transfer stage and a signal output stage, said signal output stage comprising a floating region selectively formed in a semiconductor layer and arranged for receiving signal charges from said charge transfer stage, a reset drain region selectively formed in said semiconductor layer adjacent to said floating region, an absorption drain region selectively formed in said semiconductor layer adjacent to said reset drain region, a reset gate formed with an intervening insulating film over a portion of said semiconductor layer between said floating region and said reset drain region and cyclically supplied with a drive signal to reset a potential of said floating region to a potential of said reset drain region, a barrier gate formed with an intervening insulating film over a portion of said semiconductor layer between said reset drain region and said absorption drain region and maintained at a constant voltage, and a charge injection source coupled to said reset drain region to inject charges into said reset drain region.

2. The device as claimed in claim 1, wherein said charge injection source comprises a resistor connected between said reset drain region and a reference potential line.

3. The device as claimed in claim 1, wherein said charge injection source comprises a constant current source connected between said reset drain region and a reference potential line.

4. The device as claimed in claim 3, wherein said constant current source is composed of a field effect transistor of a depletion type.

5. A charge transfer device having a charge transfer stage and a signal output stage, said signal output stage comprising an output region formed in a semiconductor layer and coupled to said charge transfer stage to receive charges therefrom, an output circuit for detecting voltages of said output region, a first control gate formed over a first portion of said semiconductor layer, said first portion being adjacent to said output region, a first reset region formed in said semiconductor layer adjacent to said first portion, said first control gate being supplied with a drive voltage to form a first channel region in said first portion, and said first reset region thereby receiving charges from said output region via said first channel region, a second control gate being supplied with a voltage of a power source and formed over a second portion of said semiconductor layer, said second portion being adjacent to said first reset region, a second reset region formed in said semiconductor layer adjacent to said second portion of said semiconductor layer and supplied with a first voltage to receive charges from said first reset region through said second portion of said semiconductor layer, and a charge injection element connected between said first reset region and reference potential line to inject charges to said first reset region.

6. A device according to claim 5, wherein said second control gate forms a second channel region in said second portion, wherein said second control gate is larger than said first control gate to lower a voltage of said first channel region to a value lower than a voltage of said second channel region.

7. A device according to claim 5, wherein said second control gate forms a second channel region in said second portion, said first portion having a conductivity type different from the conductivity type of said second portion so that a voltage of said first channel region is lower than a voltage of said second channel region.

8. A device according to claim 5, wherein said second control gate is formed over said second portion to form a second channel region in said second portion, said first portion having a first conductivity type and a first impurity concentration and said second portion having said first conductivity type and a second impurity concentration lower than said first impurity concentration so that a voltage of said first channel region is lower than a voltage of said second channel region.

9. A device according to claim 5, wherein said charge injection element comprises a resistor.

10. A device according to claim 5, wherein said charge injection element comprises a MOS transistor formed to provide a constant current.

11. A device according to claim 5, further comprising a capacitor connected to said first reset region.

12. A charge transfer device comprising:

a first semiconductor region for transferring signal charges;

a second semiconductor region supplied with said signal charges and outputting a voltage signal according to said signal charges;

a third semiconductor region having a first potential and being arranged to be supplied with said signal charges;

a fourth semiconductor region formed between said second and said third semiconductor regions;

a first control gate formed over said fourth semiconductor region and arranged for controlling potentials of said fourth semiconductor region so as to form alternatively and cyclicly a first potential barrier and a first potential well in said fourth semiconductor region and between said second and said third semiconductor region, a potential of said first potential well being deeper than said first potential so that said third semiconductor region is selectively supplied with said signal charges;

a charge injection element for injecting charges constantly to said third semiconductor region;

a fifth semiconductor region constantly electrically connected to said third semiconductor region and having a second potential well deeper than said first potential well, said fifth semiconductor region absorbing said signal charges from said second semiconductor region and said charges from said charge injection element; and a second control gate being supplied with a voltage of a power source and formed over a portion located between said third and fifth semiconductor regions.

13. A charge transfer device comprising:

a semiconductor layer;

an output region formed in said semiconductor layer;

an output circuit for detecting voltages of said output region;

a control gate formed over a first portion of said semiconductor layer, said first portion being adjacent to said output region;

a first reset region formed in said semiconductor layer adjacent to said first portion, said first control gate being supplied with a drive voltage to form a first channel region in said first portion, and said first reset region thereby receiving charges from said output region via said first channel region;

a second reset region formed in said semiconductor layer adjacent to a second portion of said semiconductor layer and supplied with a first voltage to receive charges from said first reset region through said second portion of said semiconductor layer so that a potential of the first reset region is a desired value that is substantially equal to a potential of the second portion of said semiconductor layer; and means for resetting the potential of the first reset region to the desired value in response to the potential of the first reset region varying from the desired value;

wherein the second portion of said semiconductor layer is located between said first and second reset regions;

the device further comprising a second control gate formed over said second portion of said semiconductor layer to form a second channel region in said second portion, wherein said second control gate is larger than said first control gate to lower a voltage of said first channel region to a value lower than a voltage of said second channel region.

14. The device of claim 13, wherein said means for resetting comprises a charge injection element connected between said first reset region and a reference potential line to inject charges into said first reset region to restore the potential of the first reset region to the desired value.

15. The device of claim 14, wherein the first and second reset regions are arranged so that when the potential of said first reset region has been restored to the desired value, the electrons injected into the first reset region are transferred and absorbed in the second reset region.

16. The device of claim 13, further comprising a capacitor connected to said first reset region.

17. The device of claim 14, wherein said charge injection element comprises a resistor.

18. The device of claim 14, wherein said charge injection element comprises a MOS transistor formed to provide a constant current.

* * * * *